United States Patent
Goren et al.

(10) Patent No.: US 10,928,437 B2
(45) Date of Patent: *Feb. 23, 2021

(54) METHOD OF INSPECTING A SPECIMEN AND SYSTEM THEREOF

(71) Applicant: Applied Materials Israel Ltd., Rehovot (IL)

(72) Inventors: Zvi Goren, Nes-Ziona (IL); Adi Boehm, Ramat-Gan (IL); Amit Batikoff, Petach Tikva (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 16/582,877

(22) Filed: Sep. 25, 2019

(65) Prior Publication Data

US 2020/0018789 A1 Jan. 16, 2020

Related U.S. Application Data

(60) Continuation of application No. 16/025,869, filed on Jul. 2, 2018, now Pat. No. 10,444,274, which is a division of application No. 14/668,749, filed on Mar. 25, 2015, now Pat. No. 10,012,689.

(51) Int. Cl.
*G01R 31/26* (2020.01)
*G01R 31/28* (2006.01)
*H01L 21/66* (2006.01)
*G01R 31/303* (2006.01)

(52) U.S. Cl.
CPC ..... *G01R 31/2601* (2013.01); *G01R 31/2831* (2013.01); *H01L 22/12* (2013.01); *G01R 31/303* (2013.01)

(58) Field of Classification Search
CPC . G03F 1/84; G03F 1/88; G03F 7/7065; G01R 31/2601; G01R 31/2831; G01R 31/303
USPC .......................................... 716/51
See application file for complete search history.

(56) References Cited

U.S. PATENT DOCUMENTS

| | | |
|---|---|---|
| 6,898,305 B2 | 5/2005 | Hiroi et al. |
| 7,423,746 B2 | 9/2008 | Takeda et al. |
| 7,760,347 B2 | 7/2010 | Nehamdi et al. |
| 7,760,929 B2 | 7/2010 | Orbon et al. |
| 7,869,643 B2 | 1/2011 | Litichever et al. |

(Continued)

*Primary Examiner* — Paul Dinh
(74) *Attorney, Agent, or Firm* — Lowenstein Sandler LLP

(57) ABSTRACT

Data indicative of location information of a potential defect of interest revealed in a specimen and of one or more layers of the specimen corresponding to the potential defect of interest may be received. A die layout clip may be generated in accordance with the data by deriving the die layout clip based on the location information of the potential defect of interest and the one or more layers of the specimen corresponding to the potential defect of interest. The die layout clip may include information indicative of one or more patterns characterizing an inspection area that includes the potential defect of interest of the specimen. The generated die layout clip may be transmitted to a semiconductor inspection unit where an inspection by the semiconductor inspection unit of a semiconductor wafer that includes the specimen corresponding to the potential defect of interest is based on the one or more patterns of the die layout clip.

20 Claims, 6 Drawing Sheets

(56) References Cited

U.S. PATENT DOCUMENTS

| | | |
|---|---|---|
| 7,877,722 B2 | 1/2011 | Duffy et al. |
| 8,041,443 B2 | 10/2011 | Funakoshi |
| 2002/0051565 A1 | 5/2002 | Hiroi et al. |
| 2002/0114506 A1 | 8/2002 | Hiroi et al. |
| 2007/0156379 A1* | 7/2007 | Kulkarni ............. G06F 30/30 703/14 |
| 2007/0288219 A1 | 12/2007 | Zafar et al. |
| 2008/0163140 A1 | 7/2008 | Fourquet et al. |
| 2008/0295048 A1 | 11/2008 | Nehmadi et al. |
| 2011/0170091 A1 | 7/2011 | Chang et al. |
| 2011/0286656 A1 | 11/2011 | Kulkarni et al. |
| 2012/0155741 A1 | 6/2012 | Shibuya et al. |
| 2012/0243773 A1 | 9/2012 | Kulkarni |
| 2013/0066454 A1 | 3/2013 | Geshel et al. |
| 2013/0163852 A1 | 6/2013 | Ghinovker |
| 2013/0202187 A1 | 8/2013 | Goren et al. |
| 2013/0204569 A1 | 8/2013 | Goren et al. |
| 2013/0326443 A1 | 12/2013 | Geshel |

* cited by examiner

METHOD OF INSPECTING A SPECIMEN AND SYSTEM THEREOF

CROSS REFERENCE TO RELATED APPLICATION

This continuation application claims priority to U.S. patent application Ser. No. 16/025,869 filed on Jul. 2, 2018, which is a divisional application of U.S. Pat. No. 10,012,689 filed on Mar. 25, 2015, which is hereby incorporated by reference herein.

TECHNICAL FIELD

The presently disclosed subject matter relates, in general, to the field of inspection of a specimen, and more specifically, to methods and systems for inspecting a specimen for defects.

BACKGROUND OF THE INVENTION in the semiconductor industry, devices are fabricated by a number of manufacturing processes, producing structures of an ever-decreasing size. Current demands for high density and performance associated with ultra large scale integration require formation of device features with high precision and uniformity, which in turn necessitate careful process monitoring, including frequent and detailed inspection of specimens while they are still in the form of semiconductor wafers. The term "specimen" used in this specification should be expansively construed to cover any kind of wafer, reticle and other structures, combinations and/or parts thereof used for manufacturing semiconductor integrated, circuits, magnetic heads, flat panel displays, and other thin film devices.

A variety of inspection tools can be based on non-destructive observations as, by way of non-hunting example, scanning electron microscopes, atomic force microscopes, optical inspection tools, etc. Inspection is important for debugging, specimen manufacturing processes, monitoring process variations, improving production yield, etc.

A conventional inspection process employs a two phase "inspection and review" procedure. During the first phase, the surface of a specimen is inspected at high-speed and relatively low-resolution. In the first phase a defect map is produced to show suspected locations on the specimen having high probability of a defect. During the second phase the suspected locations are more thoroughly analyzed. In some cases both phases can be implemented by the same inspection tool, and in some other cases these two phases are implemented by different inspection tools.

For purpose of illustration only, the following description is provided with respect to inspection of semiconductor wafers. Embodiments are, likewise, applicable to inspection of other specimens.

With some of the aforementioned inspection tools, a wafer and/or parts thereof can be inspected using die-to-die or cell-to-cell inspection. For instance, areas in a die such as the periphery regions which can comprise, for example, logic components, are best inspected using die-to-die inspection and thus, are checked for defects by comparison to one or more reference dies. However, in some other cases, cell-to-cell inspection can be desired. For example, areas that include a plurality of identical memory cells of one or more types are preferably checked using cell-to-cell inspection, since adjacent or nearby cells within the same die may be more similar than cells between adjacent dies. The similarities may be due to process conditions and/or the inspection tool itself. For instance, differences due to illumination, focus, or other optical irregularities may be less pronounced within a die as compared to between dies, Problems of matching proper inspection algorithm with specific inspection areas have been recognized in the conventional art and various techniques have been developed to provide solutions.

General Description

In accordance with certain aspects of the presently disclosed subject matter, there is provided a computer-based inspection unit capable to operate in conjunction with an inspection machine unit. The inspection unit comprises an I/O interface operatively connected to a processor, wherein the I/O interface is configured to obtain location information indicative of coordinates of a potential defect of interest revealed in a specimen and of one or more inspected layers corresponding to the potential defect of interest; send to a computer-based and online connected die layout clipping unit a first data indicative of the location information and dimensions of an inspection area containing the potential defect of interest and receive from the die layout clipping unit a die layout clip generated in accordance with the first data, the die layout clip comprising information indicative of one or more patterns characterizing the inspection area, and wherein the processor is operatively connected to the I/O interface and configured to specify at least one inspection algorithm of the inspection area of the specimen using the information comprised in the die layout clip received via the I/O interface. The I/O interface is further configured to send a second data indicative of the inspection algorithm specified by the processor to the inspection machine unit.

In accordance with other aspects of the presently disclosed subject matter, there is provided a computer-implemented method of inspecting a specimen. The method comprises: obtaining, by a computer-based inspection unit, location information indicative of coordinates of a potential defect of interest revealed in the specimen and of one or more inspected layers corresponding to the potential defect of interest; sending, by the inspection unit, to a computer-based and online connected die layout clipping unit a first data indicative of the location information and dimensions of an inspection area containing the potential defect of interest; receiving, by the inspection unit, from the die layout clipping unit a die layout clip generated in accordance with the first data, the die layout clip comprising information indicative of one or more patterns characterizing, the inspection area; specifying, by the inspection unit, at least one inspection algorithm of the inspection area using the information comprised in the die layout clip; and enabling, by the inspection unit, inspection of the inspection area of the specimen using the specified inspection algorithm.

In accordance with other aspects of the presently disclosed subject matter, there is provided a die layout clipping unit. The unit comprises an I/O interface configured to receive, from at least one computer-based and online connected inspection unit, a first data indicative of location information indicative of coordinates of a potential defect of interest revealed in a specimen and of one or more inspected layers corresponding to the potential defect of interest, the first data further comprising dimensions of an inspection area containing the potential defect of interest; and a processor operatively connected to the I/O interface and configured to generate a die layout clip in accordance with the first data, the die layout clip comprising information indicative of one or more patterns characterizing the inspection area, wherein the I/O interface is further configured to transmit the generated die layout clip to the at least one inspection unit.

In accordance with other aspects of the presently disclosed subject matter, there is provided a computer-implemented method of providing a die layout clip. The method comprises: receiving, by a computer-based die layout clipping unit, from at least one computer-based and online connected inspection unit, a first data indicative of location information indicative of coordinates of a potential defect of interest revealed in a specimen and of one or more inspected layers corresponding to the potential defect of interest, the first data further comprising dimensions of an inspection area containing the potential defect of interest; generating, by the die layout clipping unit, the die layout clip in accordance with the first data, the die layout clip comprising information indicative of one or more patterns characterizing the inspection area; and transmitting, by the die layout clipping unit, the generated die layout clip to the at least one inspection unit.

In accordance with other aspects of the presently disclosed subject matter, there is provided an inspection system for inspecting a specimen. The system comprises a computer-based inspection unit configured to obtain location information indicative of coordinates of a potential defect of interest revealed in the specimen, and of one or more inspected layers corresponding to the potential defect of interest; and send to a computer-based and online connected die layout clipping unit a first data indicative of the location information and dimensions of an inspection area containing a potential defect of interest. The system further comprises a die layout clipping unit configured to receive, from the inspection unit, the first data indicative of the location information and the dimensions of the inspection area; generate a die layout clip in accordance with the first data, the die layout clip comprising information indicative of one or more patterns characterizing the inspection area; and transmit the generated die layout clip to the inspection unit. The inspection unit is further configured to receive, from the die layout clipping unit the generated die layout clip; specify at least one inspection algorithm of the inspection area using the information comprised in the die layout clip; and enable inspection of the inspection area of the specimen using the specified inspection algorithm.

In accordance with other aspects of the presently disclosed subject matter, there is provided a computer-implemented method of inspecting a specimen. The method comprises: obtaining, by a computer-based inspection unit, location information indicative of coordinates of a potential defect of interest revealed in the specimen, and of one or more inspected layers corresponding to the potential defect of interest; sending, by the inspection unit, to a computer-based and online connected die layout clipping unit a first data indicative of the location information and dimensions of an inspection area containing the potential defect of interest; receiving, by the die layout clipping unit, the first data indicative of the location information and the dimensions of the inspection area; generating, by the die layout clipping unit, a die layout clip in accordance with the first data, the die layout clip comprising information indicative of one or more patterns characterizing the inspection area; transmitting, by the die layout clipping unit, the generated die layout clip to the inspection unit: receiving, by the inspection unit, the generated die layout clip; specifying, by the inspection unit, at least one inspection algorithm of the inspection area using the information comprised in the die layout clip; and enabling, by the inspection unit, inspection of the inspection area of the specimen using the specified inspection algorithm.

In accordance with other aspects of the presently disclosed subject matter, there is provided a non-transitory computer readable storage medium comprising computer readable program code embodied therein for inspecting a specimen. The computer readable program code causes a computer-based inspection unit to perform the following: obtaining location information indicative of coordinates of a potential defect of interest revealed in the specimen and of one or more inspected layers corresponding to the potential defect of interest; sending to a computer-based and online connected die layout clipping unit a first data indicative of the location information and dimensions of an inspection area containing the potential defect of interest; receiving from the die layout clipping unit a die layout clip generated in accordance with the first data, the die layout clip comprising information indicative of one or more patterns characterizing the inspection area; specifying at least one inspection algorithm of the inspection area using the information comprised in the die layout clip and enabling inspection of the inspection area of the specimen using the specified inspection algorithm.

In accordance with further aspects of the presently disclosed subject matter, and optionally, in combination with any of the above aspects, the inspection unit can further comprise a storage module configured to store one or more predefined inspection algorithms, and can be further configured to select the at least one inspection algorithm from the one or more stored predefined inspection algorithms in accordance with the information comprised in the die layout clip received from the die layout clip unit. The at least one predefined inspection algorithm can be selected from a group constituted by one or more algorithms for die-to-die inspection, one or more algorithms for cell-to-cell inspection, one or more algorithms for die-to-database inspection, and one or more algorithms for cell-to-multiple-cell inspection.

In accordance with further aspects of the presently disclosed subject matter, and optionally, in combination with any of the above aspects, the inspection unit can be further configured to communicate in real time with the die layout clipping unit for sending the first data responsive to obtaining the location information, for receiving the die layout clip and for specifying, in real time, the at least one inspection algorithm responsive to the received die layout clip.

In accordance with further aspects of the presently disclosed subject matter, and optionally, in combination with any of the above aspects, each pattern can be characterized by a predefined inspection algorithm corresponding to the pattern.

In accordance with further aspects of the presently disclosed subject matter, and optionally, in combination with any of the above aspects, the die layout clip can be generated by the die layout clipping, unit as a direct derivation of design data characterizing the specimen. Alternatively the die layout clip can be generated by extracting the die layout clip from a pre-generated die layout. The die layout clipping unit can be further configured to generate, in real time, the die layout clip responsive to receiving the first data from the at least one inspection unit, and for transmitting, in real time, the generated die layout clip.

Among advantages of certain embodiments of the presently disclosed subject matter is reducing the amount of data transferred between the one or more inspection units and the die layout clipping unit, while still being able to obtain the desired information included in a die layout clip in a high resolution.

BRIEF DESCRIPTION OF THE DRAWINGS

In order to understand the presently disclosed subject matter and to see how it may be carried out in practice, the subject matter will now be described, by way of non-limiting example only, with reference to the accompanying drawings, in which.

DETAILED DESCRIPTION

Figure 1:
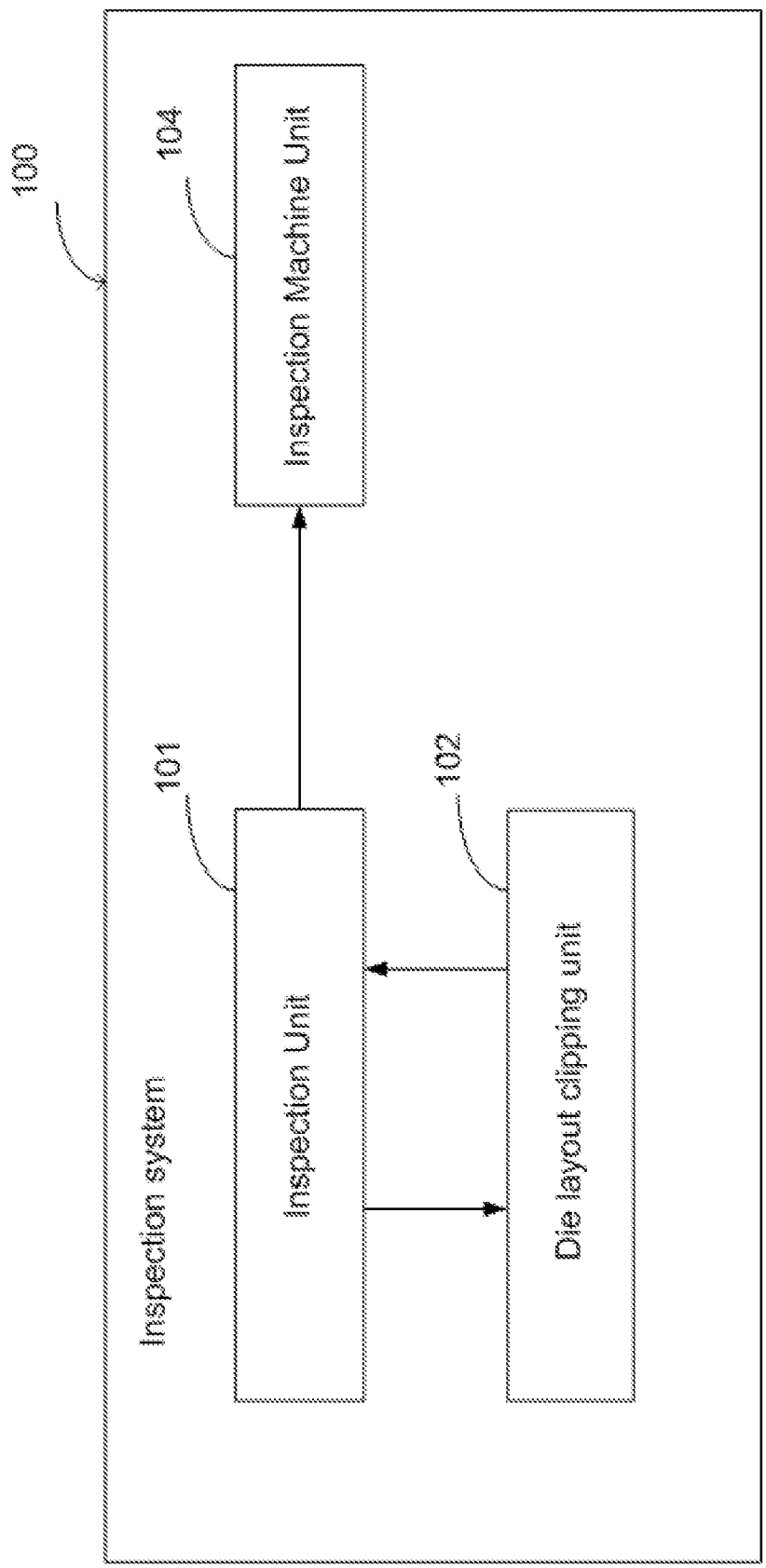
FIG. 1 is a functional block diagram schematically illustrating an inspection system, in accordance with certain embodiments of the presently disclosed subject matter.

In the following detailed description, numerous specific details are set forth in order to provide a thorough understanding of the disclosed subject matter. However, it will be understood by those skilled in the art that the present disclosed subject matter can be practiced without these specific details. In other instances, well-known methods, procedures, and components have not been described in detail so as not to obscure the present disclosed subject matter.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "obtaining", "sending", "receiving", "specifying", "enabling", "selecting", "generating,", "transmitting", "extracting", or the like, include action and/or processes of a computer that manipulate and/or transform data into other data, said data represented as physical quantities, e.g. such as electronic quantities, and/or said data representing the physical objects. The term "computer" should be expansively construed to cover any kind of electronic device with data processing capabilities, including, by way of non-limiting examples, a computer-based inspection unit, a computer-based die layout clipping unit and a processor disclosed in the present application.

The operations in accordance with the teachings herein can be performed by a computer specially constructed for the desired purposes or by a general purpose computer specially configured for the desired purpose by a computer program stored in a non-transitory computer readable storage medium.

The term "non-transitory" is used herein to exclude transitory, propagating signals, but to otherwise include any volatile or non-volatile computer memory technology suitable to the presently disclosed subject matter.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination.

Bearing this in mind, attention is drawn to FIG. 1, schematically illustrating a functional block diagram of an inspection system in accordance with certain embodiments of the presently disclosed subject matter.

An inspection system 100 illustrated in FIG. 1, comprises a computer-based inspection unit 101 operatively connected to an inspection machine unit 104. The inspection system further comprises a die layout clipping unit 102 connected on-line to one or more inspection units. The inspection system 100 can be used for inspection of a specimen (e.g. of a wafer and/or parts thereof) for defects. The inspection machine unit 104 is configured to perform the inspection of an inspection area of the specimen using an inspection algorithm specified by the inspection unit 101. The inspection area contains a potential defect of interest revealed in the specimen by one or more other inspection processes conducted beforehand or in parallel, etc. Through a further inspection process, as will be further detailed with reference to FIGS. 2-6, a decision of whether the potential defect of interest being indeed a real defect is yet to be made by the inspection machine unit, using the inspection algorithm specified by the inspection unit. Optionally, in addition to the potential defect of interest, the inspection area can contain other defects not currently intended for inspection by the inspection machine unit. The inspection area includes the extent of an observable area of the specimen that can be inspected by the inspection machine unit (i.e. Field of View (FOV) of the inspection machine unit). The inspection unit 101 is configured to obtain location information of the potential defect of interest (e.g. from one or more external inspection machines, a user and/or a processing module of the inspection machine unit, etc., as further detailed with respect to FIG. 5). Upon receiving the location information, the dimensions of the inspection area can be determined by prior knowledge given to the inspection unit, e.g. based on one or more of the following parameters: inaccuracy of the location information of the potential defect of interest, navigation error of the inspection unit, and repetition size and/or repetition direction of the inspection area, etc. The inspection unit 101 is further configured to specify the inspection algorithm based on die-related information obtained from the die layout clipping unit 102 in response to data informative of the location information and the inspection area provided by the inspection unit 101.

It should be noted that the inspection unit 101 can be implemented as a stand-alone computer to be used in conjunction with the inspection machine unit 104, as shown in FIG. 1, or alternatively its function can, at least partly, be integrated with, for example, the inspection machine unit 104. Without limiting the scope of the disclosure in any way, it should also be noted that the inspection machine unit 104 can be implemented as inspection machines of various types, such as optical imaging machines, electron beam inspection machines and so on. In some cases the inspection machine unit 104 can inspect an entire wafer or at least an entire die for detection of potential defects (such as, by way of non-limiting example, the Elite and the UVision systems by Applied Materials, Inc., etc.). In other cases the inspection machine unit 104 can be a review tool, which is typically of higher resolution (e.g. a scanning electron microscope, SEM, etc.) and which is used for ascertaining whether a potential defect is indeed a defect. Such a review tool usually inspects fragments of a die, one at a time, in higher resolution. Note that whenever the term "inspection" or its derivatives are used in this disclosure, such an inspection is not limited with respect to resolution or size of inspection area, and can be applied, by way of non-limiting example, to review tools and to lower resolution wafer inspection tools alike.

It should be noted that the term "defect" used in this specification should be expansively construed to cover any kind of abnormality or undesirable feature formed on or within any specimen. Defects may adversely affect the performance or functionality of a device formed on the specimen (e.g., reduce a characteristic such as speed or cause a device failure that may or may not cause a device to be non-working, etc. or additional devices formed on the specimen if the cause is not fixed.

The term "design data" used in the specification should be expansively construed to cover any data indicative of hierarchical physical design (layout) of a specimen and/or data derived from the physical design (e.g. through complex simulation, simple geometric and Boolean operations, etc.). Design data can be provided in different formats as, by way of non-limiting examples, GDSII format, OASIS format, etc. Design data specify structural elements of a certain design. As known in the contemporary art, a structural element can be constructed as a plurality of geometrical shapes or geometrical shapes combined with insertion of other structural elements. By way of non-limiting examples, a given structural element can comprise one or more STRUCTURE elements inserted by means of SREF, AREF directives in GDSII format, or can comprise one or more CELL elements inserted by means of PLACEMENT and REPETITION (OASIS format).

Those versed in the art will readily appreciate that the teachings of the presently disclosed subject matter are not bound by the system illustrated in FIG. 1, equivalent and/or modified functionality can be consolidated or divided in another manner and can be implemented in any appropriate combination of software, firmware and hardware.

Figure 2:
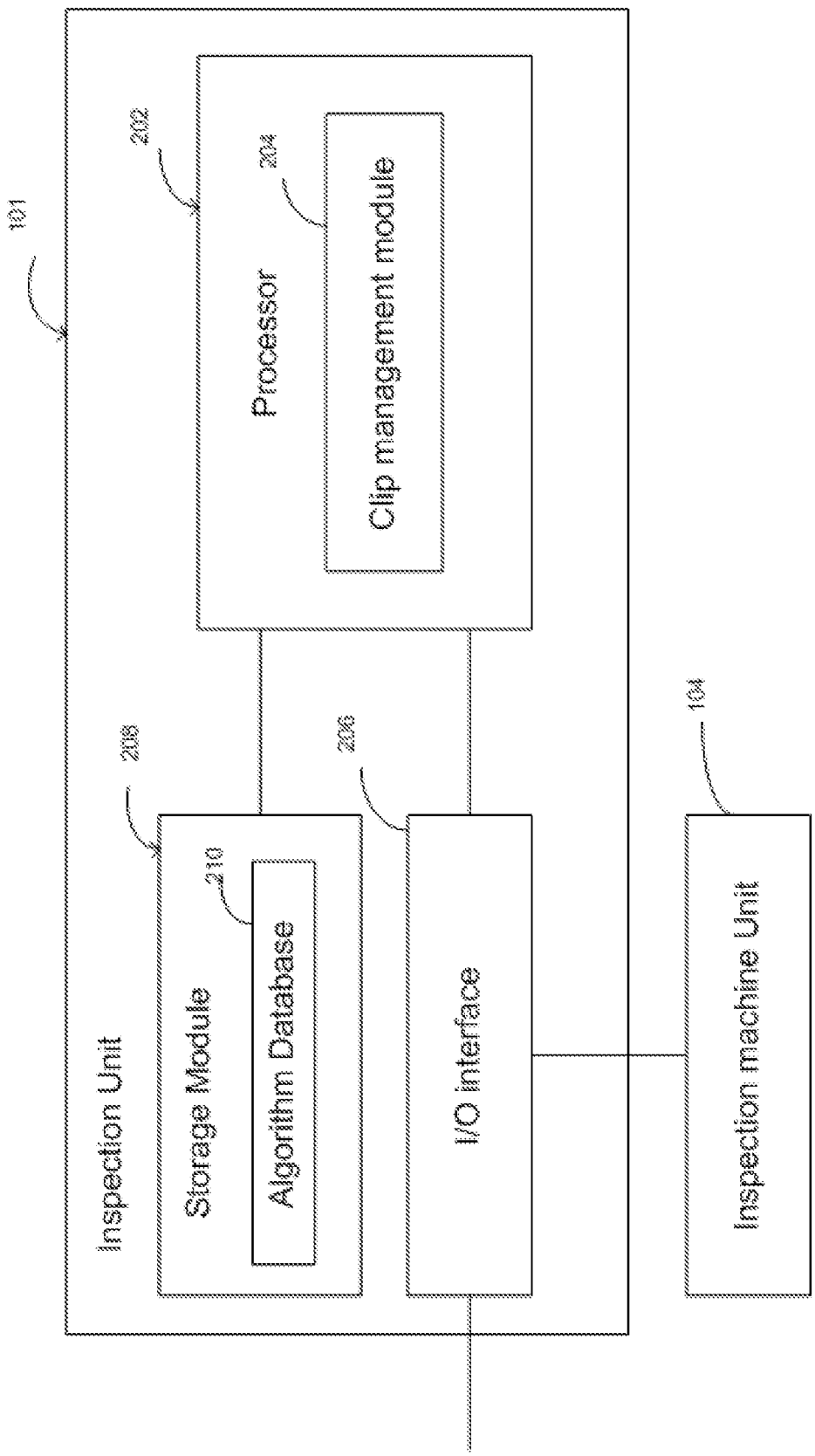
FIG. 2 is a functional block diagram schematically illustrating an inspection unit in accordance with certain embodiments of the presently disclosed subject matter.

Turning now to FIG. 2, there is shown a functional block diagram schematically illustrating the inspection unit in accordance with certain embodiments of the presently disclosed subject matter.

As illustrated, the inspection unit 101 comprises a processor 202 operatively coupled to an I/O interface 206 and to a storage module 208. According to certain embodiments, the I/O interface 206 can be configured to obtain location information indicative of coordinates of a potential defect of interest revealed in the specimen and of one or more inspected layers corresponding to the potential defect of interest. The I/O interface 206 can be further configured to send a first data indicative of the location information and dimensions of an inspection area that contains the potential defect of interest to a computer-based and online connected die layout clipping unit 102. The I/O interface is further configured to receive from the die layout clipping unit 102 a die layout clip generated in accordance with the first data. The die layout clip is configured to comprise information indicative of one or more patterns characterizing the inspection area, as further described with reference to FIG. 4. By way of non-limiting example, the patterns can be non-repetitive and repetitive. The terms "repetitive pattern" used in the specification should be expansively construed to cover any die area where the pattern is invariant under shift transformation with some shift value, i.e. is periodical regarding some periodicity value(s).

Using the information comprised in the die layout clip, the processor 202 is configured to specify at least one inspection algorithm of the inspection area. In some cases, the inspection algorithm can be specified by a clip management module 204 comprised in the processor 202.

The I/O interface 206 can send a second data indicative of the inspection algorithm specified by the processor 202 to the inspection machine unit 104 to enable inspection of the inspection area of the specimen by the inspection machine unit 104.

In accordance with certain embodiments, the inspection unit 101 can further comprise a storage module 208, the storage module comprising a non-transitory computer readable storage medium. The storage module 208 can include an algorithm database 210 that can store one or more predefined inspection algorithms, from which the processor 202 can select the at least one specified inspection algorithm. By way of non-limiting example, each pattern can be characterized by a predefined inspection algorithm corresponding to the pattern. The algorithm database can store the predefined inspection algorithms in association with the respective patterns, and the processor can specify one or more inspection algorithms by selecting from the stored algorithms, in accordance with the one or more patterns indicated in the received die layout clip.

According to certain embodiments, the processor 202 and the I/O interface 206 are further configured to perform at least one of the aforementioned operations in real time. Optionally, the I/O interface 206 can be configured to enable real-time communication to the die layout clipping unit for sending the first data responsive to obtaining the location information and/or receiving the die layout clip. Additionally or alternatively, the processor 202 can be configured to specify, in real time, the inspection algorithm responsive to receiving the die layout clip via the I/O interface 206.

The operation of the inspection unit 101 and of the various components thereof is further detailed with reference to FIG. 5.

Figure 5:
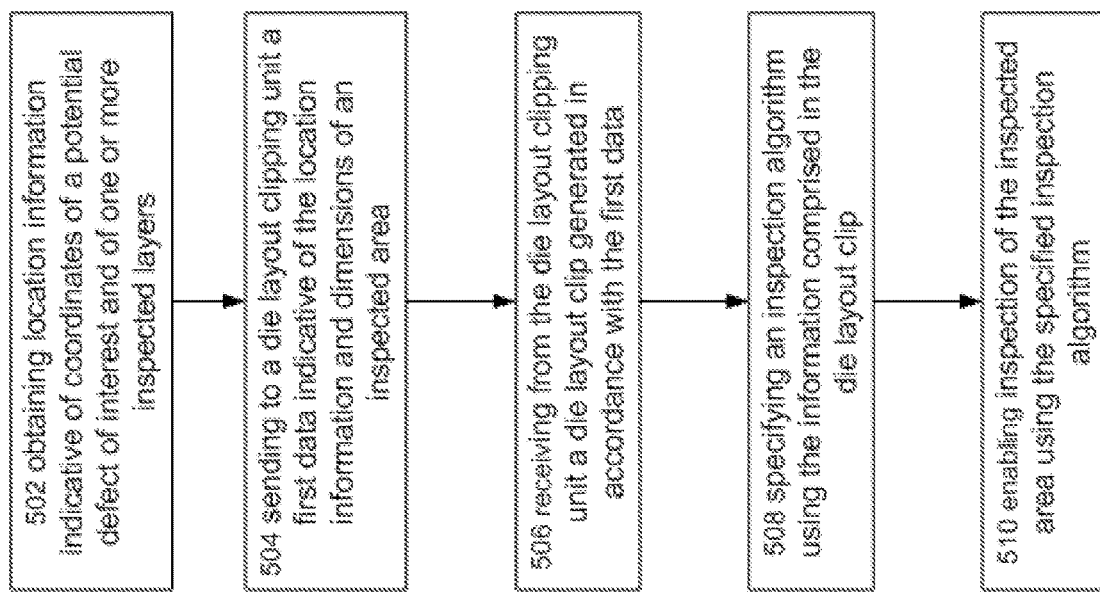
FIG. 5 is a generalized flowchart of inspecting a specimen, in accordance with certain embodiments of the presently disclosed subject matter.

While not necessarily so, the process of operation of the inspection unit 101 can correspond to some or all of the stages of the method described with respect to FIG. 5. Likewise, the method described with respect to FIG. 5 and its possible implementations can be implemented by inspection unit 101. It is therefore noted that embodiments discussed in relation to the method described with respect to FIG. 5 can also be implemented, mutatis mutandis as various embodiments of the inspection unit 101, and vice versa.

Those versed in the art will, readily appreciate that the teachings of the presently disclosed subject matter are not bound by the system illustrated in FIG. 2, and that equivalent and/or modified functionality can be consolidated or divided in another manner and can be implemented in any appropriate combination of software, firmware and hardware.

Figure 3:
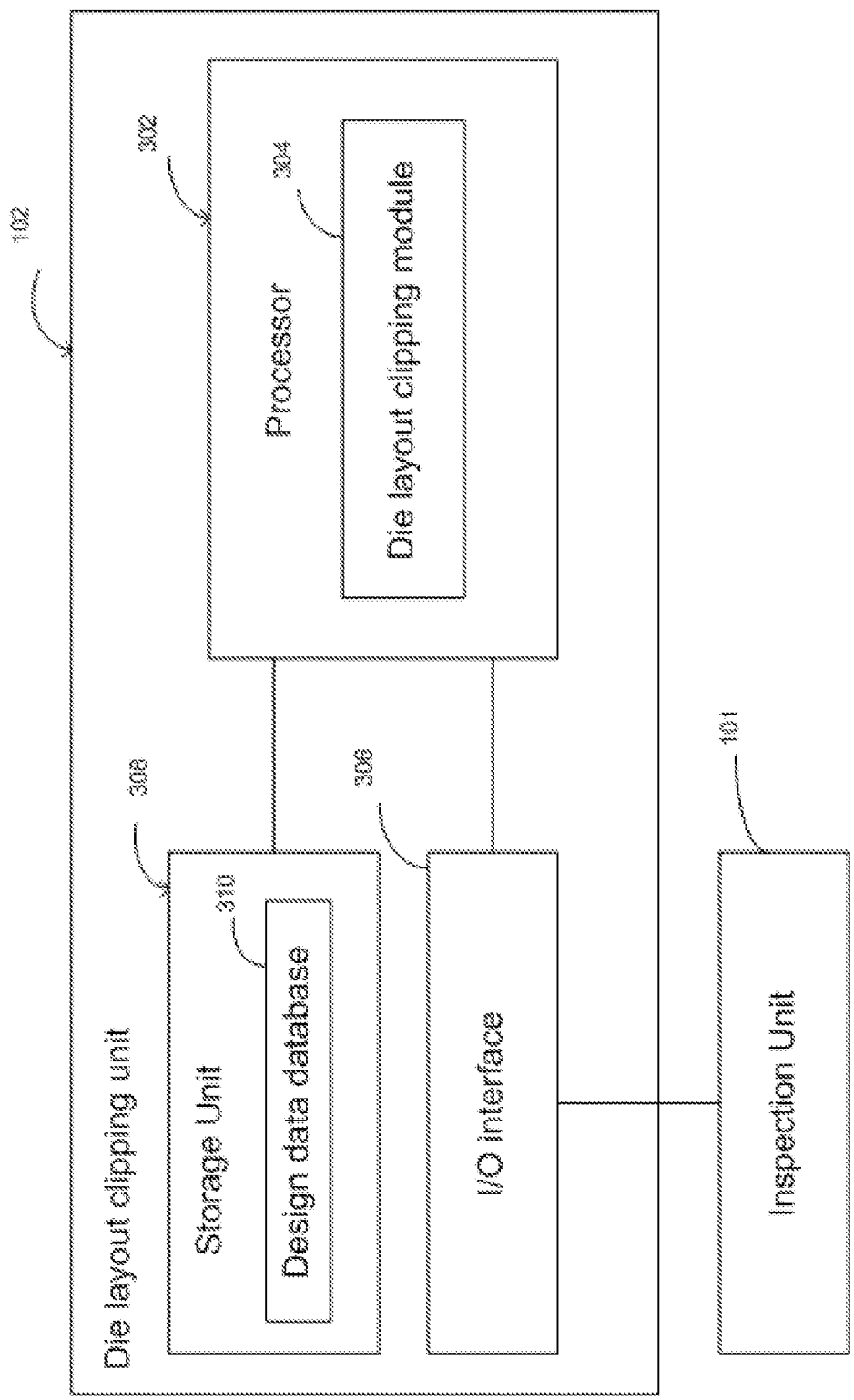
FIG. 3 is a functional block diagram schematically illustrating a die layout clipping unit in accordance with certain embodiments of the presently disclosed subject matter.

Attention is now drawn to FIG. 3. illustrating schematically a functional block diagram of a die layout clipping unit in accordance with certain embodiments of the presently disclosed subject matter.

As shown, the die layout clipping unit 102 comprises a processor 302 operatively coupled to an I/O interface 306, and to a storage module 308. As aforementioned, the die layout clipping unit 102 can be online connected with one or more inspection units (e.g. the inspection unit 101) and can be configured to provide die-related information to the inspection unit 101. Specifically, the I/O interface 306 can receive from the inspection unit 101 the first data indicative of the location information and the dimensions of the inspection area. The processor 302 can be configured to generate a die layout clip in accordance with the first data, as will be described in greater detail in relation to FIG. 6. In some cases the die layout clip can be generated by a die layout clipping module 304 comprised in the processor 302. The I/O interface can further transmit the generated die layout to the inspection unit 101.

In accordance with certain embodiments, the die layout clipping unit 102 can further comprise a storage module 308 comprising non-transitory computer-readable storage medium. The storage module 308 can include a design data database 310 that can store design data characterizing the specimen, such as the Computer Aided Design (CAD) data or a design intent of the specimen, and the die layout clip can be generated by the die layout clipping module 304 as a direct derivation of the stored design data characterizing the specimen.

According to certain embodiments, the processor 302 and the I/O interface 306 are further configured to perform at least one of the aforementioned operations in real time. Optionally, the processor 302 can be further configured to generate, in real time, the die layout clip responsive to receiving the first data via the I/O interface 306. Additionally or alternatively, the I/O interface 306 can be further configured to enable real-time communication to the inspection unit for transmitting the generated die layout clip.

The operation of the die layout clipping unit 102 and of the various components thereof is further detailed with reference to FIG. 6.

Figure 6:
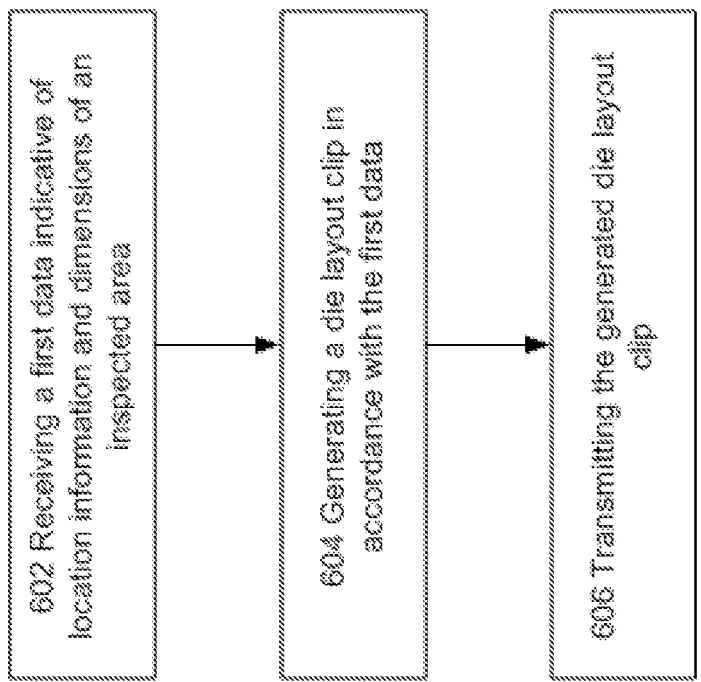
FIG. 6 is a generalized flowchart of providing a die layout clip, in accordance with certain embodiments of the presently disclosed subject matter.

While not necessarily so, the process of operation of the die layout clipping unit 102 can correspond to some or all of the stages of the method described with respect to FIG. 6. Likewise, the method described with respect to FIG. 6 and its possible implementations can be implemented by the die layout clipping unit 102. It is therefore noted that embodiments discussed in relation to the method described with respect to FIG. 6 can also be implemented, mutatis mutandis, as various embodiments of the die layout clipping unit 102, and vice versa.

Those versed in the art will readily appreciate that the teachings of the presently disclosed subject matter are not bound by the system illustrated in FIG. 3. Equivalent and/or modified functionality can be consolidated or divided in another manner and can be implemented in any appropriate combination of software, firmware and hardware.

It is noted that the inspection system 100 with respect to FIG. 1 can be implemented in a distributed computing environment, in which the aforementioned components as shown in FIG. 1, or modules thereof as described with respect to FIGS. 2 and 3, can be located in both local and remote devices, and are linked through a communication network. In addition, the aforementioned components and modules can in some cases be cloud-based.

Having described the inspection system, including the inspection unit capable of inspecting a specimen and the die layout clipping unit capable of providing a die layout clip, an exemplified die layout and a die layout clip are now described with reference to FIG. 4 in accordance with certain embodiments of the presently disclosed subject matter.

Figure 4:
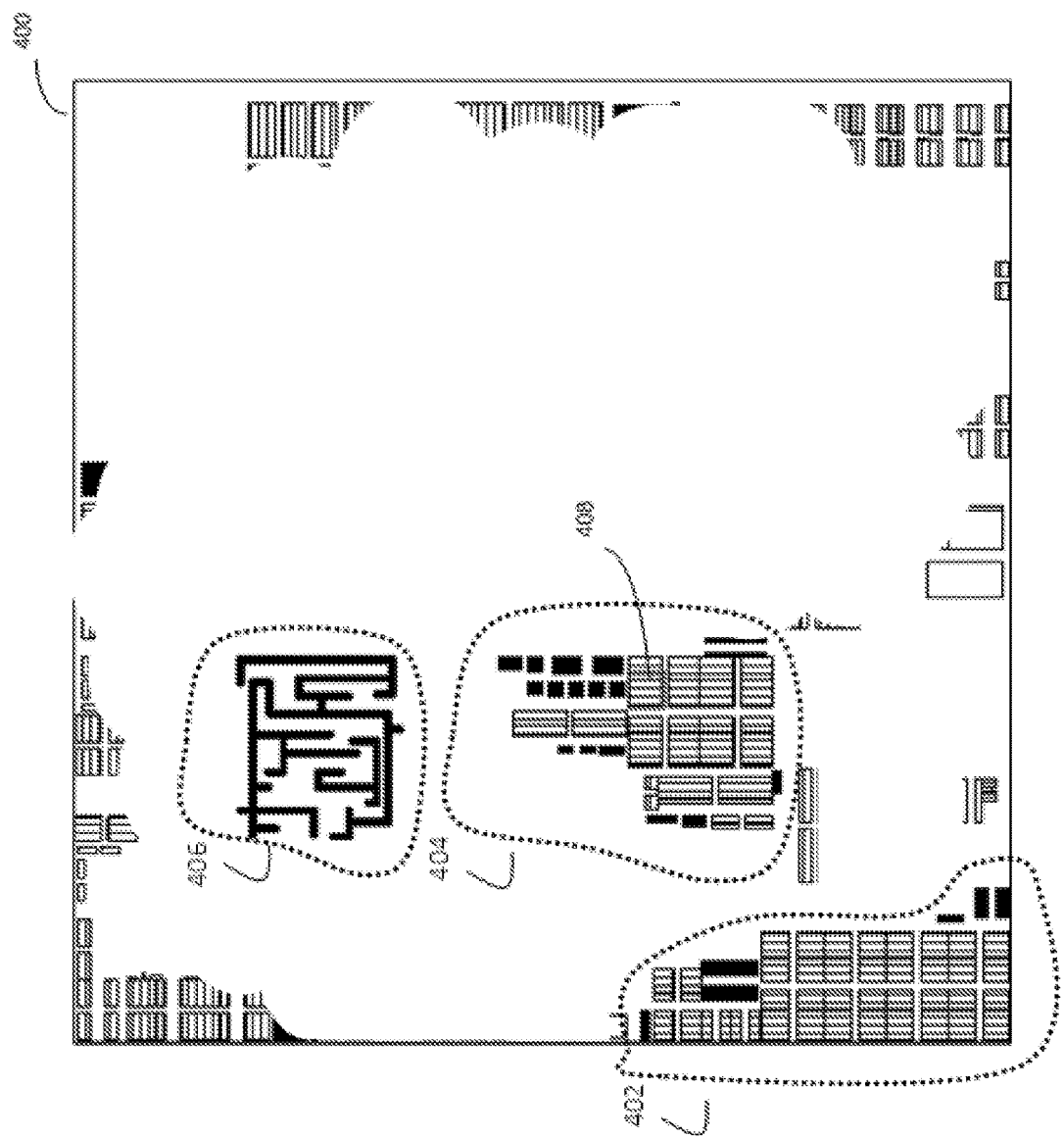
FIG. 4 is a schematic illustration of an exemplified die layout and a die layout clip thereof, in accordance with certain embodiments of the presently disclosed subject matter.

FIG. 4 illustrates an example of a die layout 400 derived from a CAD SRAM file of a corresponding die. As will be clear to a person who is of skill in the art, a single die can include a large amount of patterns. Different areas on each die may include different patterns, such as, for example, background areas (that are ideally very smooth), memory areas (that include a large number of repetitive and periodical patterns, such as periodical arrays), and logic areas (that usually do not include large quantities of adjacent repetitive patterns). A die layout can be generated based on design data of a die and comprise information indicative of one or more patterns characterizing different areas (partitions) on a die, as aforementioned. By way of non-limiting example, as shown in the die layout 400, areas 402 and 404 are exemplified as memory areas and include a large number of periodical arrays, while area 406 is exemplified as a logic area and does not include repetitive patterns. Due to the different structures and intended usages for each area, these areas may need different types of inspection algorithms respectively. For example, areas 402 and 404 that include repetitive patterns can be inspected, by way of non-limiting example, by cell-to-cell inspection. Areas that are not repetitive in nature, such as the logic area 406, may be suitable, by way of non-limiting examples, for die-to-die inspection.

As further illustrated in FIG. 4, a die layout clip 408 is a part of a die layout. According to certain embodiments, the die layout clip 408 can be generated by extracting from the pre-generated die layout 400 in accordance with a first data indicative of location information of a potential defect of interest and dimensions of an inspection area. According to some other embodiments, the die layout clip 408 can be derived directly from design data, characterizing the die in accordance with the first data, since a pre-generated die layout in some cases can cause extensive data storage consumption, as well as hardware expenses and maintenance costs thereof. While not necessarily so, the die layout clip can be generated in the shape of polygons, such as rectangles, and the die layout clip can comprise information indicative of one or more patterns characterizing the corresponding inspection area of the die. For example, as shown in FIG. 4, the die layout clip 408 includes information identifying the repetitive patterns in the corresponding inspection area, e.g. the repetitive cell size, and the repetitive cell direction, (e.g. horizontal in this case) etc. Based on the information comprised in the die layout clip, the inspection unit can select at least one predefined inspection algorithm for the designated inspection area, e.g. an algorithm for cell-to-cell inspection pertaining to the specified cell size and cell direction.

Those versed in the art will readily appreciate that the examples of the die layout and die layout clip discussed above with reference to FIG. 4 are by no means inclusive of all possible alternatives but are intended to illustrate non-limiting examples, and accordingly other ways of generation and implementation can be used in addition to or in lieu of the above.

Turning now to FIG. 5, there is shown a generalized flowchart of inspecting a specimen, in accordance with certain embodiments of the presently disclosed subject matter.

An inspection unit (e.g. the inspection unit 101) obtains (502) location information indicative of coordinates of a potential defect of interest revealed in a specimen, and of one or more inspected layers corresponding to the potential defect of interest.

According to some embodiments, the location information can be obtained directly from one or more external inspection machines, for example, inspection machines with lower resolution, and/or inspection machines using inspection technology different from the technology used in the inspection machine unit, etc. Alternatively or additionally, the location information can be obtained from a user, from a processing module (e.g. the alignment module) of the inspection machine unit 104. As aforementioned, whenever the term "inspection" or its derivatives are used in this disclosure, such an inspection is not limited with respect to resolution or size of an inspection area, and can be applied, by way of non-limiting examples, to review tools and to lower resolution inspection tools alike.

Upon receiving the location information, the inspection unit sends (504) a first data indicative of the location information and dimensions of an inspection area to a die layout clipping unit (e.g. die layout clipping unit 102) connected online to the inspection unit. As aforementioned with reference to FIG. 1, the inspection unit can determine the dimensions of the inspection area based on one or more parameters. In some cases, the inspection area can be determined in the shape of polygons, such as rectangles. For example, the coordinates of the potential defect of interest can serve as a reference point that designates either a corner or the center of the rectangular inspection area. Two dimensions determined based on the one or more parameters with directions respectively parallel to an X and Y axis can characterize the external boundaries of the inspection area so as to ascertain the size of the inspection area. Those versed in the art will readily appreciate that the teachings of the presently disclosed subject matter are, like wise, applicable to other selection of external boundaries, and/or other selection of reference points for the inspection area.

It is to be noted that the location information can be in the format of CAD coordinates, or alternatively it can be in the format of coordinates of the external inspection machines (e.g. optical inspection machines), or coordinates of the inspection machine unit 104 (e.g. SEM machines). According to certain embodiments, the location information can be derived from a defect list that is received from the external inspection machine, such as KLARF (KLA Result File). Accordingly, a plurality of different machines in the inspection process that can utilize different coordinate systems (e.g. the inspection unit 101, the die layout clipping unit 102, the inspection machine unit 104, etc.) are further configured to translate, when necessary, the coordinates specified in the location information, in the first data, in the second data, in the die layout clip, etc.

Upon sending the first data, the inspection unit receives (506) from the layout clipping unit a die layout clip generated in accordance with the first data. The generated die layout clip comprises information indicative of one or more patterns that characterize the inspection area.

According to certain embodiments, the die layout clip can be generated by the die layout clipping unit 102, in accordance with information comprised in the first data.

As described with reference to FIG. 4, the die layout clip can be extracted from a die layout, or alternatively the die layout clip can be generated by the die layout clipping unit 102 as a direct derivation of design data characterizing the die, upon receiving the first data. Due to extensive data storage consumption of the pre-generated die layout file, as well as the hardware expenses and maintenance costs thereof, generating the die layout clips on the fly, directly from the design data of the die in some cases, can be more efficient and less costly. According to some embodiments, the generated die layout clip includes at least the inspection area.

Following receiving the die layout clip from the die layout clipping unit, the inspection unit 101 specifies (508) an inspection algorithm based on the information comprised in the die layout clip. According to certain embodiments, the specified inspection algorithm can be selected among predefined inspection algorithms (e.g. die-to-die inspection algorithms, cell-to-cell inspection algorithms, die-to-database inspection algorithms, and cell-to-multiple cell inspection algorithms). By way of non-limiting examples, cell-to-cell inspection can be preferable when adjacent or nearby areas within the same die are more similar than areas belonging to different dies. Inspection areas with different periodicity can be inspected with different cell-to-cell inspection algorithms (e.g. with different periodicity values and/or direction). Some areas of a given die (e.g. periphery area comprising logic components) can be preferably inspected using die-to-die inspection. Those versed in the art will readily appreciate that certain areas of a given die can be inspected using any appropriate combination of inspection algorithms, some or all of which can be predefined.

After the inspection algorithm is specified, the inspection unit 101 can enable (510) the inspection machine unit 104 to perform the inspection of the inspection area of the specimen using the specified inspection algorithm. The inspection machine unit 104 can inspect the inspection area according to the specified inspection algorithm. In some cases, the inspection can include inspecting reference areas located e.g. in different cell(s) or different die(s). According to certain embodiments reference data used by the inspection machine unit 104 for analyzing inspection results can be specified in the inspection algorithm provided by the inspection unit.

Optionally, the detected defects can be sent to a classification unit to be classified into certain categories according to one or more predefined criteria, such as one or more attributes of the defects, and/or one or more attributes of the one or more patterned features formed on the specimen proximate to the defects. It is to be noted that the classification unit can be either implemented as an integrated module of the inspection machine unit 104, or it can be implemented as an external system that connected with the inspection machine unit 104 over cable or wireless connection.

According to certain embodiments, the sequence of operations described with reference to FIG. 5 can be carried out in real time. Optionally, receiving the generated die layout clip from the die layout clipping unit responsive to sending to the die layout clipping unit the first data and/or specifying the inspection algorithm responsive to the die layout clip received from the die layout clipping unit, can be performed in real time.

Turning to FIG. 6, there is shown a flowchart of providing a die layout clip, in accordance with certain embodiments of the presently disclosed subject matter.

A die layout clipping unit (e.g. the die layout clipping unit 102) receives (602) the first data indicative of the location information and dimensions of the inspection area, from at least one inspection unit (e.g. the inspection unit 101) connected online to the die layout clipping unit. The location information, as aforementioned, can be indicative of coordinates of a potential defect of interest revealed in a specimen, and of one or more inspected layers corresponding to the potential defect of interest.

Upon receiving the first data, the die layout clipping unit generates (604) a die layout clip in accordance with the first data. The generated die layout clip comprises information indicative of one or more patterns characterizing the inspection area.

According to certain embodiments, the die layout clipping unit can generate the die layout clip as a direct derivation of design data characterizing the specimen, upon receiving the first data from the at least one inspection unit.

According to other embodiments, the die layout clipping unit can generate the die layout clip by extracting the die layout clip from a pre-generated die layout which comprises information indicative of one or more patterns characterizing the area of the entire die.

Following generating the die layout clip, the die layout clipping unit transmits (606) the generated die layout clip back to the at least one inspection unit so that the at least one inspection unit can specify an inspection algorithm based on the information comprised in the die layout clip.

According to certain embodiments, the sequence of operations described with reference to FIG. 6 can be carried out in real time. Optionally, generating the die layout clip responsive to receiving the first data, and/or transmitting the generated die layout clip responsive to generating the die layout clip can be performed in real time.

It is to be understood that the presently disclosed subject matter is not limited in its application to the details set forth in the description contained herein or illustrated in the drawings. The presently disclosed subject matter is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based can readily be utilized as a basis for designing other structures, methods, and systems for carrying out the several purposes of the present presently disclosed subject matter.

It will also be understood that the system according to the presently disclosed subject matter can be implemented, at least partly, as a suitably programmed computer. Likewise, the presently disclosed subject matter contemplates a computer program being readable by a computer for executing the disclosed method. The presently disclosed subject matter further contemplates a machine-readable memory tangibly embodying a program of instructions executable by the machine for executing the disclosed method.

What is claimed is:

1. A system comprising:
   a memory; and
   a processor, operatively coupled with the memory, to:
   receive data indicative of location information of a potential defect of interest revealed in a specimen and of one or more layers of the specimen corresponding to the potential defect of interest;
   generate a die layout clip in accordance with the data by deriving the die layout clip based on the location information of the potential defect of interest and the one or more layers of the specimen corresponding to the potential defect of interest, the die layout clip comprising information indicative of one or more patterns characterizing an inspection area that includes the potential defect of interest of the specimen; and
   transmit the generated die layout clip to a semiconductor inspection unit for selection of a predefined inspection operation for the potential defect of interest based on the one or more patterns of the die layout clip, wherein an inspection of a semiconductor wafer that includes the specimen corresponding to the potential defect of interest is based on the predefined inspection operation.

2. The system of claim 1, wherein one or more patterns correspond to repetitive patterns, and wherein the die layout clip further comprises information indicative of a size and direction of a respective repetitive pattern.

3. The system of claim 1, wherein the inspection by the inspection unit corresponds to an inspection operation that is based on the one or more patterns of the die layout clip.

4. The system of claim 1, wherein the data is further indicative of a dimension of the inspection area.

5. The system of claim 1, wherein the data comprises coordinates of the potential defect of interest in the specimen.

6. The system of claim 1, wherein the die layout clip corresponds to a portion of a die layout.

7. The system of claim 1, wherein the die layout clip is associated with one or more polygons.

8. A method comprising:
   receiving data indicative of location information of a potential defect of interest revealed in a specimen and of one or more layers of the specimen corresponding to the potential defect of interest;
   generating, by a processor, a die layout clip in accordance with the data by deriving the die layout clip based on the location information of the potential defect of interest and the one or more layers of the specimen corresponding to the potential defect of interest, the die layout clip comprising information indicative of one or more patterns characterizing an inspection area that includes the potential defect of interest of the specimen; and
   transmitting the generated die layout clip to a semiconductor inspection unit for selection of a predefined inspection operation for the potential defect of interest based on the one or more patterns of the die layout clip, wherein an inspection of a semiconductor wafer that includes the specimen corresponding to the potential defect of interest is based on the predefined inspection operation.

9. The method of claim 8, wherein one or more patterns correspond to repetitive patterns, and wherein the die layout clip further comprises information indicative of a size and direction of a respective repetitive pattern.

10. The method of claim 8, wherein the inspection by the inspection unit corresponds to an inspection operation that is based on the one or more patterns of the die layout clip.

11. The method of claim 8, wherein the data is further indicative of a dimension of the inspection area.

12. The method of claim 8, wherein the data comprises coordinates of the potential defect of interest in the specimen.

13. The method of claim 8, wherein the die layout clip corresponds to a portion of a die layout.

14. The method of claim 8, wherein the die layout clip is associated with one or more polygons.

15. A non-transitory computer readable medium, which when executed by a processor, causes the processor to perform operations comprising:
   receiving data indicative of location information of a potential defect of interest revealed in a specimen and of one or more layers of the specimen corresponding to the potential defect of interest;
   generating a die layout clip in accordance with the data by deriving the die layout clip based on the location information of the potential defect of interest and the one or more layers of the specimen corresponding to the potential defect of interest, the die layout clip comprising information indicative of one or more patterns characterizing an inspection area that includes the potential defect of interest of the specimen; and transmitting the generated die layout clip to a semiconductor inspection unit for selection of a predefined inspection operation for the potential defect of interest based on the one or more patterns of the die layout clip, wherein an inspection of a semiconductor wafer that includes the specimen corresponding to the potential defect of interest is based on the predefined inspection operation.

16. The non-transitory computer readable medium of claim 15, wherein one or more patterns correspond to repetitive patterns, and wherein the die layout clip further comprises information indicative of a size and direction of a respective repetitive pattern.

17. The non-transitory computer readable medium of claim 15, wherein the inspection by the inspection unit corresponds to an inspection operation that is based on the one or more patterns of the die layout clip.

18. The non-transitory computer readable medium of claim 15, wherein the data is further indicative of a dimension of the inspection area.

19. The non-transitory computer readable medium of claim 15, wherein the data comprises coordinates of the potential defect of interest in the specimen.

20. The non-transitory computer readable medium of claim 15, wherein the die layout clip corresponds to a portion of a die layout.

* * * * *